United States Patent
Kessler et al.

(10) Patent No.: US 8,660,504 B2
(45) Date of Patent: Feb. 25, 2014

(54) METHOD FOR CONTROLLING THE TRANSMISSION POWER OF A TRANSMITTER SYSTEM INTEGRATED IN AN ELECTRONIC HOUSING OF A MOTOR VEHICLE, AND ELECTRONIC HOUSING THUS OBTAINED

(75) Inventors: Sébastien Kessler, Toulouse (FR); Rachid Benbouhout, Cugnaux (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 0 days.

(21) Appl. No.: 13/519,471

(22) PCT Filed: Oct. 22, 2010

(86) PCT No.: PCT/EP2010/006483
§ 371 (c)(1),
(2), (4) Date: Aug. 31, 2012

(87) PCT Pub. No.: WO2011/079887
PCT Pub. Date: Jul. 7, 2011

(65) Prior Publication Data
US 2012/0322396 A1 Dec. 20, 2012

(30) Foreign Application Priority Data

Dec. 28, 2009 (FR) ...................................... 09 06360

(51) Int. Cl.
*H01Q 11/12* (2006.01)
*H04B 1/04* (2006.01)
(52) U.S. Cl.
USPC ...................................................... 455/127.2

(58) Field of Classification Search
USPC ...................... 455/115.1, 127.1–127.3, 550.1
See application file for complete search history.

(56) References Cited

U.S. PATENT DOCUMENTS

| | | | |
|---|---|---|---|
| 6,615,028 B1 * | 9/2003 | Loke et al. .................. | 455/127.1 |
| 6,681,101 B1 * | 1/2004 | Eidson et al. ............... | 455/127.1 |
| 7,412,213 B1 * | 8/2008 | Groe et al. ..................... | 455/108 |
| 7,853,290 B2 * | 12/2010 | Itkin et al. .................. | 455/552.1 |
| 8,249,573 B2 * | 8/2012 | Rofougaran .................. | 455/418 |
| 2002/0044050 A1 | 4/2002 | Derbyshire et al. | |
| 2005/0132791 A1 | 6/2005 | Hayashi | |
| 2005/0156723 A1 | 7/2005 | Fujii | |

OTHER PUBLICATIONS

International Search Report, dated Dec. 6, 2010, from corresponding PCT application.

* cited by examiner

*Primary Examiner* — Nhan Le
(74) *Attorney, Agent, or Firm* — Young & Thompson

(57) ABSTRACT

Method for regulating the transmission power of a transmitter system (2, 5-7) incorporated in an electronic module (1) of an automobile. A transmitter system (2, 5-7) is produced which includes an amplification stage (2, 5) having an adjustable amplification gain. Furthermore, in a phase prior to the operation of the electronic module, a compensation table is stored for each type of transmitter system, which is representative of the amplification gains to be applied to maintain a constant transmission power according to the value of external parameters representative of the environment of the transmitter system, and the value of the offset of the amplification stage is stored for each electronic module. Finally, during the operation of an electronic module, the amplification gain is adjusted so as to compensate the offset of the amplification stage, and according to the environment by the use of the compensation table.

4 Claims, 1 Drawing Sheet

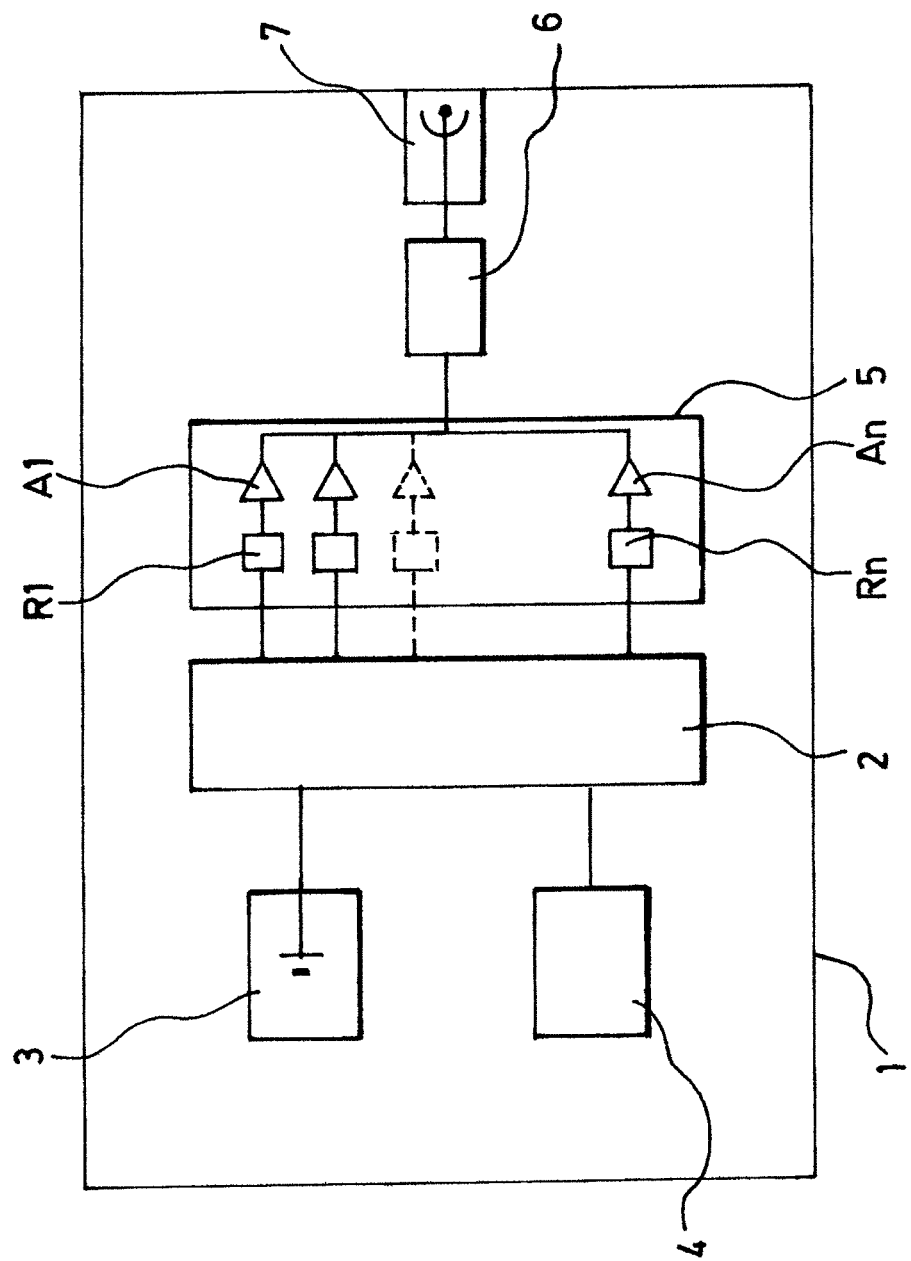

METHOD FOR CONTROLLING THE TRANSMISSION POWER OF A TRANSMITTER SYSTEM INTEGRATED IN AN ELECTRONIC HOUSING OF A MOTOR VEHICLE, AND ELECTRONIC HOUSING THUS OBTAINED

BACKGROUND OF THE INVENTION

1. Field of the Invention

The invention relates to a method for regulating the transmission power of a transmitter system incorporated in an electronic module of an automobile. It extends to an electronic module for implementing this regulation method.

2. Description of the Related Art

More and more automobiles have electronic systems such as systems for monitoring operating parameters of members of the vehicle, or access systems for locking and unlocking the openings of said vehicle.

These electronic systems conventionally comprise electronic modules, a central processor unit installed in the vehicle, and transmission means associated with the central processor unit and incorporated in each electronic module and designed to enable a dialog between said central processing unit and said electronic module in order to implement a given application.

Examples of monitoring systems thus include the systems for monitoring operating parameters of wheels of a vehicle, comprising, mounted on each of said wheels, an electronic module incorporating an electrical power supply battery, a microprocessor, a transmitter system, and sensors dedicated to measuring parameters, such as pressure or temperature of the tires fitted on these wheels, and intended to enable the driver to be informed of any abnormal variation of the measured parameter.

One of the problems encountered in the operation of such monitoring systems lies in the wide dispersion, for electronic modules of one and the same type, of the transmission powers of the transmitter systems, which may, for a conventional type of electronic module intended to be mounted on a vehicle wheel, vary over a range of the order of 6 dB between a maximum power obtained with a new battery and components that have a high nominal power, and a minimum power obtained with a weak battery and components that have a low nominal power.

Because of this dispersion, in practice, and firstly, the transmission power must be raised, which directly penalizes the electrical consumption and the size and the cost of the various components (battery, etc.).

Furthermore, each additional decibel on the tolerances has direct repercussions on the parameters of the monitoring system: margin needed to allow for the location of the wheels for a system monitoring operating parameters of said wheels, surface area of the zone covered around the vehicle for systems for accessing said vehicle, etc.

These data make the use of the electronic modules of the current monitoring systems restrictive.

SUMMARY OF THE INVENTION

The present invention aims to overcome this drawback and its main objective is to provide a method for regulating the transmission power of a transmitter system incorporated in an electronic module of an automobile, designed to minimize the tolerances on said transmission power.

To this end, the invention targets a method for regulating the transmission power of a transmitter system incorporated in an electronic module of an automobile, whereby a transmitter system is produced which comprises an amplification stage having an adjustable amplification gain designed so that the transmission power extends in a predetermined range of operating powers.

Furthermore, according to this regulation method and in a phase prior to the operation of the electronic module:

a compensation table for each type of transmitter system is established and stored, which is representative of the amplification gains to be applied to maintain a constant transmission power in a predetermined range of operating powers, according to the value of external parameters representative of the environment of the transmitter system, such as, in particular, the temperature in the electronic module, the electrical power supply voltage of said transmitter system, and the value of the offset of the amplification stage is measured and stored for each electronic module.

Finally, according to this regulation method and, during the operation of an electronic module, in order to obtain a given transmission power, the external parameters representative of the environment of the transmitter system are periodically measured, and an amplification gain is determined and applied that is on the one hand designed to compensate the offset of the amplification stage, and on the other hand adjusted according to the environment by the use of the compensation table.

Such a regulation method is therefore designed, after a preliminary characterization phase, to provide, firstly, for each electronic module, a compensation of the offset thereof, that is to say a compensation of the dispersion of the powers between the various transmitter systems of one and the same type, linked to the manufacturing tolerances, and secondly a regulation of the transmission power according to the environment (temperature, electrical power supply voltage, etc.) by the use of a compensation table.

Because of this, the tolerances are significantly reduced, with the direct consequence being a reduction of the maximum transmission power of the transmitter system and therefore a reduction of the consumption, of the size of the components, etc.

As an example, such a method results, for an electronic module of a system for monitoring operating parameters of the wheels of a vehicle, in the tolerance being reduced from 6 dB to 2.5 dB, resulting in a gain of 3.5 dB on the system margin required for the locating function which is thus much easier to integrate.

According to one advantageous implementation of the invention, an amplification stage is used which comprises a plurality of cascaded individual amplifiers, designed to provide a step-by-step regulation of the transmission power.

The invention extends to an electronic module of an automobile comprising:

a transmitter system comprising an amplification stage having an adjustable amplification gain designed so that the transmission power extends in a predetermined range of operating powers, means for measuring external parameters representative of the environment of the transmitter system, such as, in particular, the temperature in the electronic module, the electrical power supply voltage of said transmitter system, and a microprocessor:

comprising means for storing, on the one hand, for each type of electronic module, a compensation table representative of the amplification gains to be applied to maintain a constant transmission power in the range of operating powers, according to the value of the external parameters measured by the measurement means, and, on the other hand, for each electronic module, the value of the offset of the amplification stage, programmed, during the operation of the electronic module, in order to obtain a given transmission power, to control periodic measurements of the external parameters representative of the environment of the transmitter system, and to determine and apply an amplification gain on the one hand designed to compensate the offset of the amplification stage, and on the other hand adjusted according to the environment by the use of the compensation table.

Furthermore, advantageously, the amplification stage comprises a plurality of cascaded individual amplifiers, designed to provide a step-by-step regulation of the transmission power.

BRIEF DESCRIPTION OF THE DRAWING FIGURES

Other features, aims and advantages of the invention will emerge from the following detailed description with reference to the appended drawing which represents, as a nonlimiting example thereof, a preferred embodiment. In this drawing, the single FIG. 1 is a diagram representative of an electronic module according to the invention for an electronic system of an automobile.

DETAILED DESCRIPTION OF THE INVENTION

The regulation method according to the invention can be implemented in particular in order to regulate the transmission power of an electronic module 1, such as that represented in FIG. 1, designed:

either to equip a wheel of a vehicle in order to measure operating parameters of said wheel and to transmit data representative of the location of the wheel and measured parameters to a central processing unit installed on the vehicle, or to be used in order to lock and unlock the openings of a vehicle.

Usually, such an electronic module 1 incorporates a microprocessor 2 powered by means of a battery 3, to which are connected measurement sensors such as 4, for example for measuring the temperature in the context of a vehicle access system, or for measuring operating parameters such as pressure, temperature, of the wheel equipped with said electronic module, in the context of a system for monitoring operating parameters of the wheels of a vehicle.

This electronic module 1 also comprises a transmitter system comprising an amplification stage 5 designed to deliver an amplified signal to an adapter 6 associated with a transmitting antenna 7.

According to the invention, the amplification stage 5 comprises a plurality of cascaded individual amplifiers A1-An, each associated with a register R1-Rn, so that the amplification circuit consists of a number x of adjustable amplifiers A1-An, with $1 \leq x \leq n$.

It should however be noted that the adjustment of the amplification gain can be obtained by means of an amplification stage of different design from that described above, for example by means of an amplification stage comprising, in succession, fixed-gain amplifiers and a drivable attenuator.

In order to implement the method according to the invention by means of an electronic module 1 described above, and firstly, in a preliminary characterization phase:

for each type of transmitter system, that is to say for each electronic module type (same structural and functional characteristics and same application), a compensation table is established and stored which is representative of the amplification gains to be applied to maintain a constant transmission power in a range of operating powers, determined according to the value of external parameters representative of the environment of the transmitter system, such as, in particular, temperature in the electronic module 1, electrical power supply voltage of said transmitter system, and, for each electronic module 1 taken individually, the value of the offset of the amplification stage, representative of the dispersion of the powers between the various transmitter systems of one and the same type and linked to the manufacturing tolerances, is measured and stored.

Once this preliminary phase is completed, during the operation of an electronic module 1 and in order to obtain a given transmission power, the method of the invention consists in periodically measuring the external parameters representative of the environment of the transmitter system 5-7, and in determining and applying an amplification gain on the one hand designed to compensate the offset of the amplification stage 5, and on the other hand adjusted according to the environment by the use of the compensation table.

According to the embodiment represented in FIG. 1, these modifications of the amplification gain are obtained by adjusting the number of active registers R1-Rn and therefore the number of amplifiers A1-An mobilized.

The invention claimed is:

1. A method for regulating the transmission power of a transmitter system (5-7) incorporated in an electronic module (1) of an automobile, wherein a transmitter system (5-7) is produced which comprises an amplification stage (5) having an adjustable amplification gain designed so that the transmission power extends in a predetermined range of operating powers, and in that:

in a phase prior to the operation of the electronic module (1):
a compensation table for the transmitter system (5-7) is established and stored, which is representative of the amplification gains to be applied to maintain a constant transmission power in a predetermined range of operating powers, according to the value of external parameters representative of the environment of the transmitter system (5-7), such that, in particular, the temperature in the electronic module (1), the electrical power supply voltage of said transmitter system,
and the value of the offset of the amplification stage is measured and stored for the electronic module (1), and, during the operation of an electronic module (1), in order to obtain a given transmission power, the external parameters representative of the environment of the transmitter system (5-7) are periodically measured, and an amplification gain is determined and applied that is on the one hand designed to compensate the offset of the amplification stage (5), and on the other hand adjusted according to the environment by the use of the compensation table.

2. The regulation method as claimed in claim 1, wherein an amplification stage (5) is used which comprises a plurality of individual amplifiers (A1-An), designed to provide a step-by-step regulation of the transmission power.

3. An electronic module (1) of an automobile, comprising:
a transmitter system (5-7) comprising an amplification stage (5) having an adjustable amplification gain designed so that the transmission power extends in a predetermined range of operating powers,
means (4) for measuring external parameters representative of the environment of the transmitter system (5-7), such that, in particular, the temperature in the electronic module (1), the electrical power supply voltage of said transmitter system,
and a microprocessor (2):
  comprising means for storing, on the one hand, for the electronic module (1), a compensation table representative of the amplification gains to be applied to maintain a constant transmission power in the range of operating powers, according to the value of the external parameters measured by the measurement means (4), and, on the other hand, for the electronic module (1), the value of the offset of the amplification stage (5),
  programmed, during the operation of the electronic module (1), in order to obtain a given transmission power, to control periodic measurements of the external parameters representative of the environment of the transmitter system (5-7), and to determine and apply an amplification gain on the one hand designed to compensate the offset of the amplification stage (5), and on the other hand adjusted according to the environment by the use of the compensation table.

4. The electronic module (1) as claimed in claim 3, wherein the amplification stage (5) comprises a plurality of individual amplifiers (A1-An), designed to provide a step-by-step regulation of the transmission power.

* * * * *